(12) United States Patent
Chang et al.

(10) Patent No.: US 10,097,389 B1
(45) Date of Patent: Oct. 9, 2018

(54) SIGNAL MODULATOR

(71) Applicant: NATIONAL CHUNG SHAN INSTITUTE OF SCIENCE AND TECHNOLOGY, Taoyuan (TW)

(72) Inventors: Hong-Yeh Chang, New Taipei (TW); Xiang Lin, Zhunan Township (TW); Chien-Te Yu, Taoyuan (TW); Hung-Ting Chou, New Taipei (TW)

(73) Assignee: NATIONAL CHUNG SHAN INSTITUTE OF SCIENCE AND TECHNOLOGY (TW)

( * ) Notice: Subject to any disclaimer, the term of this patent is extended or adjusted under 35 U.S.C. 154(b) by 0 days.

(21) Appl. No.: 15/830,019

(22) Filed: Dec. 4, 2017

(51) Int. Cl.
*H04L 27/18* (2006.01)
*H04L 27/20* (2006.01)
*H04L 27/36* (2006.01)
*H01P 5/16* (2006.01)
*H03H 7/42* (2006.01)

(52) U.S. Cl.
CPC .......... *H04L 27/20* (2013.01); *H01P 5/16* (2013.01); *H03H 7/42* (2013.01); *H04L 27/36* (2013.01)

(58) Field of Classification Search
USPC .................................. 375/219; 398/187, 49
See application file for complete search history.

(56) References Cited

U.S. PATENT DOCUMENTS

| | | | | |
|---|---|---|---|---|
| 5,625,729 A | * | 4/1997 | Brown | G02B 6/34 359/573 |
| 2013/0195157 A1 | * | 8/2013 | Xu | H04L 27/2272 375/219 |
| 2015/0189408 A1 | * | 7/2015 | Chen | H04Q 11/0005 398/49 |
| 2015/0326321 A1 | * | 11/2015 | Cho | H04B 10/556 398/187 |

* cited by examiner

*Primary Examiner* — Eva Puente
(74) *Attorney, Agent, or Firm* — Schmeiser, Olsen & Watts, LLP

(57) ABSTRACT

A reflective modulator comprises a coupler, two diodes and two DC block units. The coupler has an input end used to output an output signal, an output end used to output an output signal, a first load end connected to one of the diodes and a second load end connected to another one of the diodes. The DC block units connect between the diodes and the coupler for DC blocking. A message signal is selectively inputted to both of the two DC block units for operating the state of the two diodes. A BPSK modulator using the reflective modulator and a quadrature modulator using the BPSK modulator are also introduced.

18 Claims, 6 Drawing Sheets

SIGNAL MODULATOR

FIELD OF THE INVENTION

The present disclosure relates to signal modulators of a digital modulation system and, more particularly, to signal modulators of a digital modulation system, each of which can output an output signal according to one or more message signal.

BACKGROUND OF THE INVENTION

Signal modulator is an important part of the digital modulation system. Key features of signal modulators are RF bandwidth, modulation bandwidth, local oscillation drive power and modulation accuracy. Several types of signal modulators are Gilbert mixers, diode mixers, reflective modulators and so on. The Gilbert mixers have the advantages of low loss, high harmonic suppression and high isolation, but have the disadvantage of lower operating frequency, usually only below 10-GHz, and ease of DC power consumption. The diode mixers have the disadvantage of requiring a higher drive power of the local oscillator signal. The reflective modulators have less influence on the phase and amplitude error caused by the process variation, and can have a wider operating bandwidth and lower required local oscillator drive power. However, reflective modulators have the disadvantage of low isolation. Moreover, the reflective modulators use more passive circuits, and thus required circuit area of the reflective modulators is quite affected by the operating frequency.

Accordingly, it is imperative to provide signal modulators which can overcome the aforesaid drawbacks of the conventional signal modulator(s).

SUMMARY OF THE INVENTION

In view of the aforesaid drawbacks of the prior art, it is an objective of the present disclosure to provide signal modulators feature broadband, low insertion loss, low required local oscillation drive power, low phase and amplitude imbalance, excellent modulation quality and small required die area.

In order to achieve the above and other objectives, the present disclosure provides a reflective modulator which comprises a coupler, a first diode, a second diode, a first DC (Direct Current) block unit and a second DC block unit.

The coupler has an input end, an output end, a first load end and a second load end, the input end being used to receive an input signal, the output end being used to output an output signal. The input end is used to receive an input signal. The output end is used to output an output signal. The first DC block unit connects between the first diode and the first load end of the coupler for DC blocking. The second DC block unit connects between the second diode and the second load end of the coupler for DC blocking. A message signal is inputted to both of the first and second DC block units for operating the states of the first and second diodes.

Regarding the reflective modulator, the first and second diodes turn on when the message signal is large enough, and the first and second diodes turn off when the message signal is not large enough.

Regarding the reflective modulator, the first DC block unit includes a first capacitor and a first resistor, the second DC block unit includes a second capacitor and a second resistor, the first capacitor is connected between the first diode and the first load end of the coupler for DC blocking, the first resistor is connected with the first capacitor and the first diode, the second capacitor is connected between the second diode and the second load end of the coupler for DC blocking, and the second resistor is connected with the second capacitor and the second diode.

Regarding the reflective modulator, the first and second diodes are implemented by PIN diodes.

Regarding the reflective modulator, the input signal is generated from a local oscillator and the output signal is used for radio frequency.

In order to achieve the above and other objectives, the present disclosure provides a BPSK modulator which comprises a balun, a first reflective modulator, a second reflective modulator and a power combiner.

The balun has a first conductor, a second conductor, a third conductor and a fourth conductor. The first conductor and the second conductor are connected and used to have equal currents in opposite directions. One end of the third conductor magnetically couples to the first conductor. Another end of the third conductor connects to ground. One end of the fourth conductor magnetically couples to the second conductor. Another end of the fourth conductor connects to ground. A first input end of the first reflective modulator connects to the third conductor. A second input end of the second reflective modulator connects to the fourth conductor. The power combiner connects to a first output end of the first reflective modulator and a second output end of the second reflective modulator. A first message signal is inputted to the first reflective modulator. A second message signal is inputted to the second reflective modulator. The first message signal and the second message signal are a pair of differential signals.

Regarding the BPSK modulator, the first reflective modulator comprises a first coupler, a first diode, a second diode, a first DC (Direct-Current) block unit and a second DC block unit, the first coupler having the first input end, the first output end, a first load end and a second load end, the first DC block unit connecting between the first diode and the first load end of the first coupler for DC blocking, the second DC block unit connected between the second diode and the second load end of the first coupler for DC blocking, the first message signal inputting to both of the first and second DC block units for operating the state of the first and second diodes.

Regarding the BPSK modulator, the second reflective modulator comprises a second coupler, a third diode, a fourth diode, a third DC block unit and a fourth DC block unit, the second coupler having the second input end, the second output end, a third load end and a fourth load end, the third DC block unit connecting between the third diode and the third load end of the second coupler for DC blocking, the fourth DC block unit connecting between the fourth diode and the fourth load end of the second coupler for DC blocking, the second message signal inputting to both of the third and fourth DC block units for operating the state of the third and fourth diodes.

Regarding the BPSK modulator, the first and second diodes turn on when the first message signal is large enough, and the first and second diodes turn off when the first message signal is not large enough; and the third and fourth diodes turn on when the second message signal is large enough, and the third and fourth diodes turn off when the second message signal is not large enough.

Regarding the BPSK modulator, wherein the first DC block unit includes a first capacitor and a first resistor, the second DC block unit includes a second capacitor and a second resistor, the first capacitor is connected between the first diode and the first load end of the first coupler for DC blocking, the first resistor is connected with the first capacitor and the first diode, the second capacitor is connected between the second diode and the second load end of the first coupler for DC blocking, and the second resistor is connected with the second capacitor and the second diode Regarding the BPSK modulator, wherein the third DC block unit includes a third capacitor and a third resistor, the fourth DC block unit includes a fourth capacitor and a fourth resistor, the third capacitor is connected between the third diode and the third load end of the second coupler for DC blocking, the third resistor is connected with the third capacitor and the third diode, the fourth capacitor is connected between the fourth diode and the fourth load end of the second coupler for DC blocking, and the fourth resistor is connected with the fourth capacitor and the fourth diode.

Regarding the BPSK modulator, the first, second, third and fourth diodes are implemented by PIN diodes.

Regarding the BPSK modulator, an input signal is generated from a local oscillator and inputted to the balun, and an output signal is outputted from the power combiner and used for radio frequency.

Regarding the BPSK modulator, the BPSK modulator is integrated in a monolithic microwave integrated circuit.

In order to achieve the above and other objectives, the present disclosure provides a quadrature modulator. The quadrature modulator comprises a Wilkinson power divider, a first BPSK (Binary Phase Shift Keying) modulator, a second BPSK modulator and a Lange coupler.

The Wilkinson power divider has a power input end, a first power output end and a second power output end. The first BPSK modulator connected to the first power output end of the Wilkinson power divider. The second BPSK modulator connected to the second power output end of the Wilkinson power divider, the second BPSK modulator generating a second output signal. The Lange coupler connected to the first BPSK modulator and the second BPSK modulator for receiving a first output signal and a second output signal. A first message signal and a second message signal are inputted to the first BPSK modulator. A third message signal and a fourth message signal are inputted to the second BPSK modulator. The first BPSK modulator generates the first output signal according to the first message signal, the second message signal, and an input from the Wilkinson power divider. The second BPSK modulator generates the second output signal according to the third message signal, the fourth message signal, and an input from the Wilkinson power divider.

Regarding the quadrature modulator, the first BPSK modulator comprises a first balun, a first reflective modulator, a second reflective modulator and a first power combiner, the first balun having a first conductor, a second conductor, a third conductor and a fourth conductor, the first conductor and the second conductor being connected and used to have equal currents in opposite directions, one end of the third conductor magnetically coupling to the first conductor and another end of the third conductor connecting to ground, one end of the fourth conductor magnetically coupling to the second conductor and another end of the fourth conductor connecting to ground, a first input end of the first reflective modulator connecting to the third conductor, a second input end of the second reflective modulator connecting to the fourth conductor, the first power combiner connecting to a first output end of the first reflective modulator and a second output end of the second reflective modulator, the first message signal inputting to the first reflective modulator, the second message signal inputting to the second reflective modulator, the first message signal and the second message signal being a pair of differential signals.

Regarding the quadrature modulator, the second BPSK modulator comprises a second balun, a third reflective modulator, a fourth reflective modulator and a second power combiner, the second balun having a fifth conductor, a sixth conductor, a seventh conductor and an eighth conductor, the fifth conductor and the sixth conductor being connected and used to have equal currents in opposite directions, one end of the seventh conductor connecting to the fifth conductor and another end of the seventh conductor connecting to ground, one end of the eighth conductor connecting to the sixth conductor and another end of the eighth conductor connecting to ground, a third input end of the third reflective modulator connecting to the seventh conductor, a fourth input end of the fourth reflective modulator connecting to the eighth conductor, the second power combiner connecting to a third output end of the third reflective modulator and a fourth output end of the fourth reflective modulator, the third message signal inputting to the third reflective modulator, the fourth message signal inputting to the fourth reflective modulator, the third message signal and the fourth message signal being a pair of differential signals.

Regarding the quadrature modulator, the first reflective modulator comprises a first coupler, a first diode, a second diode, a first DC (Direct-Current) block unit and a second DC block unit, the first coupler having the first input end, the first output end, a first load end and a second load end, the first diode connecting to the first load end of the first coupler, the second diode connecting to the second load end of the first coupler, the first DC block unit connecting between the first diode and the first load end of the first coupler for DC blocking, the second DC block unit connected between the second diode and the second load end of the first coupler for DC blocking, the first message signal inputting to both of the first and second DC block units for operating the state of the first and second diodes.

Regarding the quadrature modulator, the second reflective modulator comprises a second coupler, a third diode, a fourth diode, a third DC block unit and a fourth DC block unit, the second coupler having the second input end, the second output end, a third load end and a fourth load end, the third diode connecting to the third load end of the second coupler, the fourth diode connecting to the fourth load end of the second coupler, the third DC block unit connecting between the third diode and the third load end of the second coupler for DC blocking, the fourth DC block unit connecting between the fourth diode and the fourth load end of the second coupler for DC blocking, the second message signal inputting to both of the third and fourth DC block units for operating the state of the third and fourth diodes.

Regarding the quadrature modulator, the third reflective modulator comprises a third coupler, a fifth diode, a sixth diode, a fifth DC block unit and a sixth DC block unit, the third coupler having the third input end, the third output end, a fifth load end and a sixth load end, the fifth diode connecting to the fifth load end of the third coupler, the sixth diode connecting to the sixth load end of the third coupler, the fifth DC block unit connecting between the fifth diode and the fifth load end of the third coupler for DC blocking, the sixth DC block unit connecting between the sixth diode and the sixth load end of the third coupler for DC blocking, the third message signal inputting to both of the fifth and sixth DC block units for operating the state of the fifth and sixth diodes.

Regarding the quadrature modulator, the fourth reflective modulator comprises a fourth coupler, a seventh diode, an eighth diode, a seventh DC block unit and an eighth DC block unit, the fourth coupler having the fourth input end, the fourth output end, a seventh load end and a eighth load end, the seventh diode connecting to the seventh load end of the fourth coupler, the eighth diode connecting to the eighth load end of the fourth coupler, the seventh DC block unit connecting between the seventh diode and the seventh load end of the fourth coupler for DC blocking, the eighth DC block unit connecting between the eighth diode and the eighth load end of the fourth coupler for DC blocking, the fourth message signal inputting to both of the seventh and eighth DC block units for operating the state of the seventh and eighth diodes.

Regarding the quadrature modulator, the first DC block unit includes a first capacitor and a first resistor, the second DC block unit includes a second capacitor and a second resistor, the first capacitor is connected between the first diode and the first load end of the first coupler for DC blocking, the first resistor is connected with the first capacitor and the first diode, the second capacitor is connected between the second diode and the second load end of the first coupler for DC blocking, and the second resistor is connected with the second capacitor and the second diode.

Regarding the quadrature modulator, the third DC block unit includes a third capacitor and a third resistor, the fourth DC block unit includes a fourth capacitor and a fourth resistor, the third capacitor is connected between the third diode and the third load end of the second coupler for DC blocking, the third resistor is connected with the third capacitor and the third diode, the fourth capacitor is connected between the fourth diode and the fourth load end of the second coupler for DC blocking, and the fourth resistor is connected with the fourth capacitor and the fourth diode.

Regarding the quadrature modulator, the fifth DC block unit includes a fifth capacitor and a fifth resistor, the sixth DC block unit includes a sixth capacitor and a sixth resistor, the fifth capacitor is connected between the fifth diode and the fifth load end of the third coupler for DC blocking, the fifth resistor is connected with the fifth capacitor and the fifth diode, the sixth capacitor is connected between the sixth diode and the sixth load end of the third coupler for DC blocking, and the sixth resistor is connected with the sixth capacitor and the sixth diode.

Regarding the quadrature modulator, the seventh DC block unit includes a seventh capacitor and a seventh resistor, the eighth DC block unit includes a eighth capacitor and a eighth resistor, the seventh capacitor is connected between the seventh diode and the seventh load end of the fourth coupler for DC blocking, the seventh resistor is connected with the seventh capacitor and the seventh diode, the eighth capacitor is connected between the eighth diode and the eighth load end of the fourth coupler for DC blocking, and the eighth resistor is connected with the eighth capacitor and the eighth diode.

Regarding the quadrature modulator, the first, second, third, fourth, fifth, sixth, seventh and eighth diodes are implemented by PIN diodes.

Regarding the quadrature modulator, an input signal inputted to the power input end of Wilkinson power divider is generated from a local oscillator, and an output signal is outputted from the Lange coupler and used for radio frequency.

Regarding the quadrature modulator, the quadrature modulator is integrated in a monolithic microwave integrated circuit.

In conclusion, the aforesaid signal modulators feature broadband, low insertion loss, low required local oscillation drive power, low phase and amplitude imbalance, excellent modulation quality and small required die area.

BRIEF DESCRIPTION OF THE DRAWINGS

Objectives, features, and advantages of the present disclosure are hereunder illustrated with specific embodiments in conjunction with the accompanying drawings.

DETAILED DESCRIPTION OF THE PREFERRED EMBODIMENTS

Figure 1:
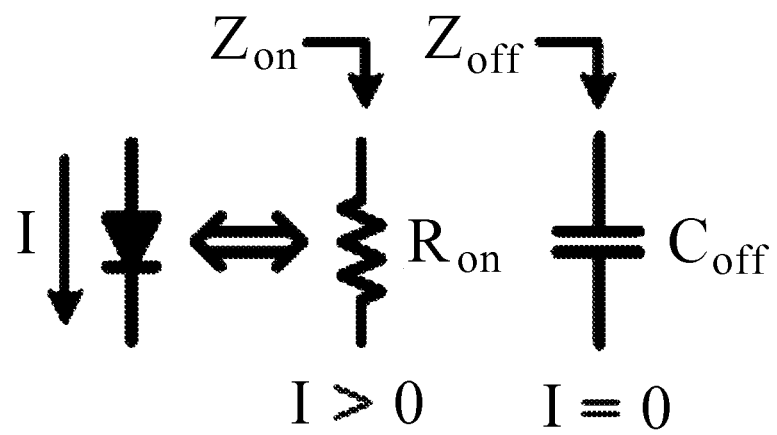
FIG. 1 shows an equivalent circuit diagram of a diode being conducting and non-conducting.

Referring to FIG. 1, FIG. 1 shows an equivalent circuit diagram of a diode being conducting and non-conducting. A diode can be equivalent to a small resistor ($R_{on}$) in a view of signal operations when the diode has sufficient cross-voltage across the diode to conduct the diode and flow through a current. A diode can be equivalent to a small capacitor ($C_{off}$) in a view of signal operations when the diode does not have sufficient cross-voltage across the diode to conduct the diode and flow through a current. The diode conduction and non-conduction switching characteristics can be used in reflective modulators.

Figure 2:
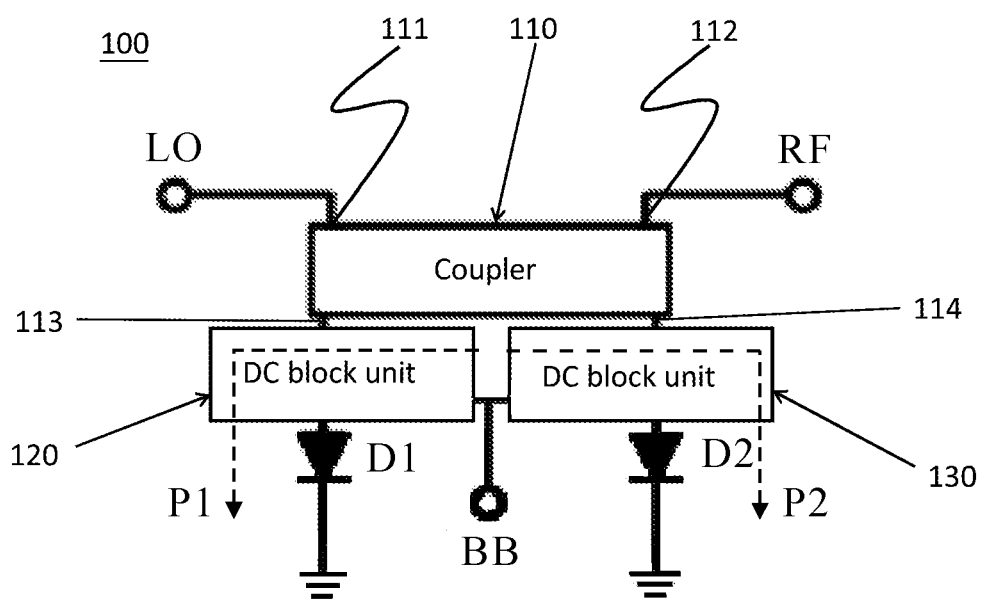
FIG. 2 is a circuit diagram of a reflective modulator according to an embodiment of the present disclosure.

Referring to FIG. 2, FIG. 2 is a circuit diagram of a reflective modulator according to an embodiment of the present disclosure. The reflective modulator 100 comprises a coupler 110, a diode D1, a diode D2, a DC (Direct Current) block unit 120 and a DC block unit 130. The coupler 110 has an input end 111, an output end 112, a first load end 113 and a second load end 114. The input end 111 is used to receive a local oscillating signal LO generated from a local oscillator. The output end 112 is used to output an output signal RF which the local oscillating signal LO is modulated by a message signal BB.

The first DC block unit 120 is connected between the first diode D1 and the first load end 113 of the coupler 110 for DC blocking. The second DC block unit 130 is connected between the second diode D2 and the second load end 114 of the coupler 110 for DC blocking.

A message signal BB is selectively inputted to both of the DC blocks unit 120 and the DC block unit 130. The diodes D1 and D2 turn on when the message signal BB is inputted to the DC block units 120, 130 and goes through the bias paths P1, P2, i.e. the message signal BB is large enough to turn on the diodes D1 and D2. The diodes D1 and D2 turn off when the message signal BB is not large enough.

The reflection coefficient of the coupler 110 changes according to the state of the diodes D1, D2. That is, the refection coefficient of the coupler 110 corresponding to the conducting states of the diodes D1, D2 is not the same as that corresponding to the non-conducting states of the diodes D1, D2. The phase of the output signal RF is also changed by the states of the diodes D1, D2, and that is the phase of the output signal RF corresponding to the conducting states of the diodes D1, D2 is not the same as that corresponding to the non-conducting states of the diodes D1, D2.

The coupler 110 can be a 90-degree coupler for example, then the phase difference of the radio signals corresponding to the conducting states and non-conducting states of the diodes D1, D2 is ideally 180 degrees. For example, the phase of the output signal RF ideally can be zero degrees when the diodes D1, D2 turn off, and the phase of the output signal RF ideally can be 180 degrees when the diodes D1, D2 turn on.

The insertion loss can be the minimum if the coupler 110 is a 90-degree coupler and the phases of the radio signal are 0 and 180 degrees (i.e. the first and second load ends 113, 114 are simultaneously opened or shorted). However, this disclosure does not limit to it. For example, the coupler 110 can be a N-degree coupler, wherein N is not equal to 90. For example, the phases of the radio signal are M1 and M2 degrees, wherein M1 is not equal to 0 and M2 is not equal to 180.

Comparing to replacing the diodes D1, D2 by transistors, which may cause higher insertion loss and lower output power, this embodiment uses diodes to overcome the aforesaid drawbacks. Further, in this embodiment, the diodes D1, D2 are implemented by PIN diodes, which can use potassium arsenide as a substrate, can have more advantages than other kinds of diodes. Specifically, comparing to the diode, the transistor has greater parasitic effects between turn-on and turn-off state, such as a larger off capacitance and conduction inductance, and makes the circuit performance deterioration. The short-circuit and open-circuit impedances of a PIN diode can be quite closer among many kinds of diodes so that the modulator of this embodiment has better linearity and modulation quality than other kinds of diodes and the transistor for the digital modulation system. In addition, the modulator of this embodiment also has lower insertion loss, that is, the required local oscillator drive power of the modulator of this embodiment is smaller and the output power of the modulator of this embodiment is larger by the accompanied effect of amplitude modulation. Therefore, the modulator of this embodiment has no additional need of voltage and current conversion circuit and is ideal for millimeter-wave band applications.

Figure 3:
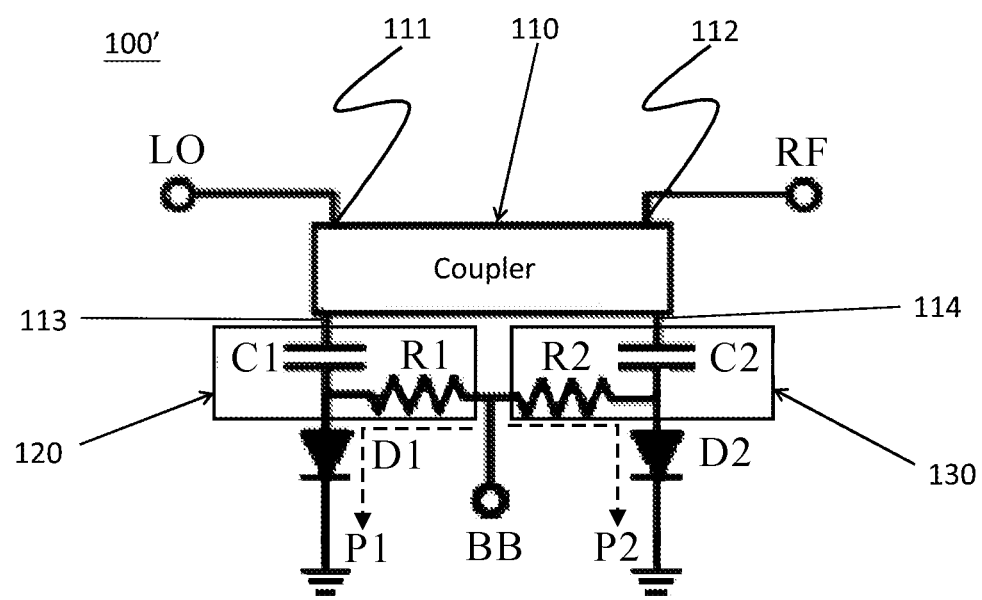
FIG. 3 is a detailed circuit diagram of a reflective modulator according to an embodiment of the present disclosure.

Referring to FIG. 3, FIG. 3 is a detailed circuit diagram of a reflective modulator according to an embodiment of the present disclosure. In FIG. 3, the DC block unit 120 of the reflective modulator 100' includes a capacitor C1 and a resistor R1, and the DC block unit 130 of the reflective modulator 100' includes a capacitor C2 and a resistor R2. The capacitor C1 is connected between the diode D1 and the first load end 113 of the coupler 110. The resistor R1 is connected with the capacitor C1 and the diode D1. The capacitor C2 is connected between the diode D2 and the second load end 114 of the coupler 110. The resistor R2 is connected with the capacitor C2 and the diode D2.

The capacitors C1, C2 are used to prevent the DC bias of the diodes D1, D2 from interfering with other circuits, such as the coupler 110. The capacitor C1 and the capacitor C2 can have capacitances of 680 uF. The resistors R1, R2 are used to provide the DC bias path and isolate the output signal from the DC path. The larger the resistance of the resistors R1, R2, the better the signal isolation effect of the output signal but the worse the bandwidth of the modulator is. To make tradeoff, the resistance of the resistors R1, R2 can be 500 ohms.

In this embodiment, a threshold value T1 for turning on the diode D1 equals to $V_{d1} I_{d1}*R1$, wherein $V_{d1}$ is a diode threshold voltage of the diode D1 and $I_{d1}$ is current flowed through the resistor R1. A threshold value T2 for turning on the diodes D2 equals to $V_{d2} I_{d2}*R2$, wherein $V_{d2}$ is a diode threshold voltage of the diode D2 and $I_{d2}$ is current flowed through the resistor R2. The threshold value T1 equals to the threshold value T2 when the resistance of the resistor R1 equals to the resistance of the resistor R2 and the diode threshold voltage of the diode D1 equals to the diode threshold voltage of the diode D2. Therefore, both of the diodes D1, D2 turn on when the message signal BB is larger than or equal to the threshold values T1, T2, while both of the diodes D1, D2 turn off when the message signal BB is smaller than the threshold values T1, T2.

Figure 4:
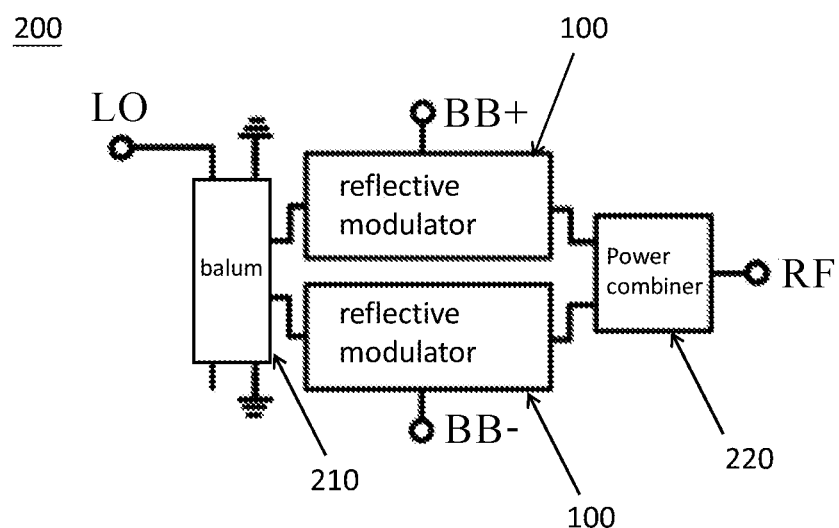
FIG. 4 is a circuit diagram of a BPSK modulator according to an embodiment of the present disclosure.

Referring to FIG. 4, FIG. 4 is a circuit diagram of a BPSK modulator according to an embodiment of the present disclosure. The BPSK modulator 200 comprises a balun 210, two identical reflective modulators 100 and a power combiner 220. The reflective modulators 100 connect to the balun, respectively. The power combiner 220 connects to the reflective modulators 100, respectively. One message signal BB+ is inputted to one of the reflective modulators 100 and another one message signal BB− is inputted to another one of the reflective modulators 100. The message signal BB+, BB− is a pair of differential signals, that is, the message signal BB+, BB− is not all set to low nor all set to high. The balun 210 is used to receive an input signal generated from a local oscillator. The power combiner 220 is used to output an output signal RF used for radio frequency.

Figure 5:
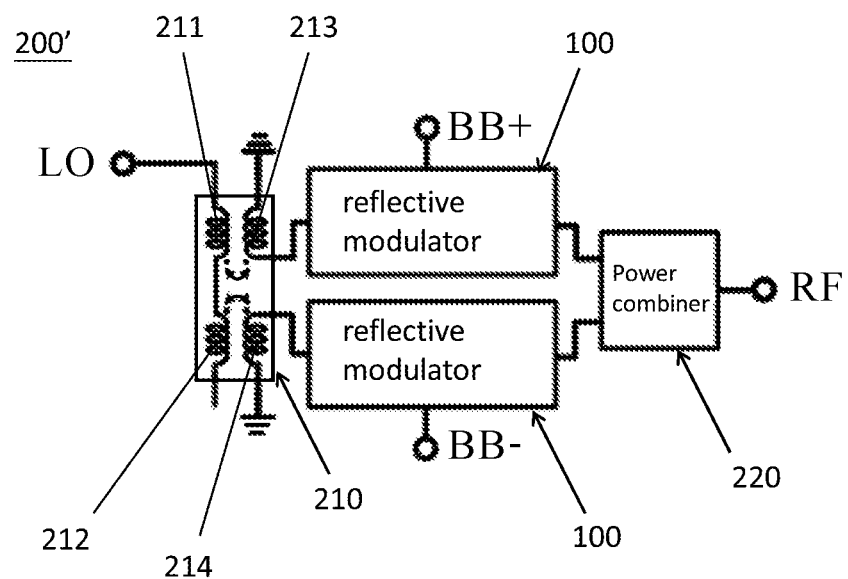
FIG. 5 is a circuit diagram of a BPSK modulator according to an embodiment of the present disclosure.

Referring to FIG. 5, FIG. 5 is a circuit diagram of a BPSK modulator according to an embodiment of the present disclosure. The balun 210 of the BPSK modulator 200' can be a 180 degree balun and has coil conductors 211-214. The coil conductors 211 212 are connected and used to have equal currents in opposite directions. One end of the coil conductor 213 magnetically couples to the coil conductor 211. Another end of the coil conductor 213 connects to ground. One end of the coil conductor 214 magnetically couples to the coil conductor 212. Another end of the coil conductor 214 connects to ground.

In FIG. 4 and FIG. 5, an input end of one of the reflective modulators 100 connects to the coil conductor 213 and an input end of another one of the reflective modulators 100 connects to the coil conductor 214. The power combiner 220 connects to output ends of the reflective modulators 100.

The reflective modulators 100 is used as two-way reflective modulators. For example, when the message signal BB+ is set to high and the message signal BB− is set to low, the phase of the output signal RF is ideally 0 degrees, which is in a state (−1); and when the message signal BB+ is set to low and the message signal BB− is set to high, the phase of the output signal RF is ideally 180 degrees. which is in another state (−2), wherein the two states have the same insertion loss. The message signals BB+, BB− can be baseband signals. The output signal should be at a minimum value when message signals BB+, BB− have the same bias voltage at half of the high potential. In this case, the circuit is turned off.

The reflective modulators 100 of FIG. 4 and FIG. 5 can be identical to the reflective modulators 100, 100' of FIG. 2 and FIG. 3. Therefore, the BPSK modulator of FIG. 4 or FIG. 5 has two couplers, four diodes, four DC block units and four bias paths in two reflective modulators, wherein each of the four DC block units has a capacitor and a resistor which are configured as FIG. 2. However, FIG. 4 and FIG. 5 do not show the detailed circuit diagrams with above elements for the object of convenience. The four diodes can be implemented by PIN diodes which can use potassium arsenide as a substrate. The BPSK modulator 200, 200' can be integrated in a monolithic microwave integrated circuit.

Figure 6:
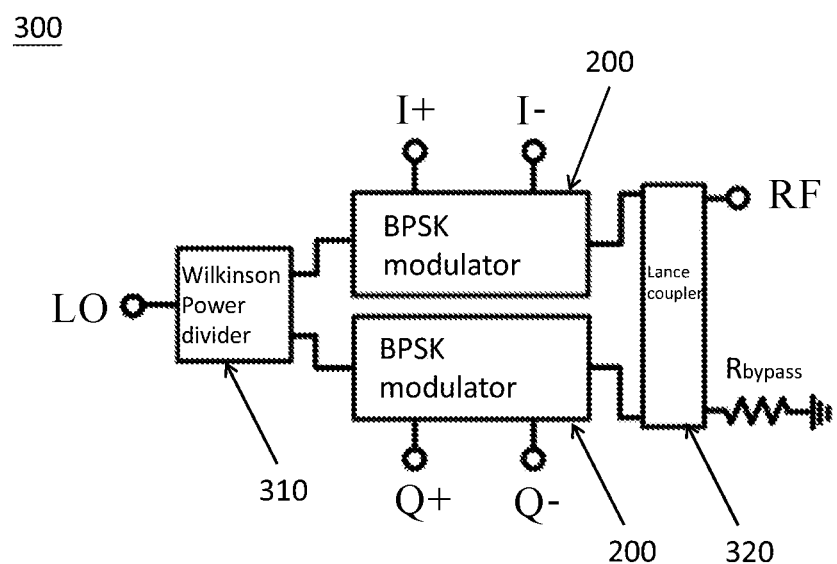
FIG. 6 is a circuit diagram of a quadrature modulator according to an embodiment of the present disclosure.

Referring to FIG. 6, FIG. 6 is a circuit diagram of a quadrature modulator according to an embodiment of the present disclosure. The quadrature modulator 300 comprises a Wilkinson power divider 310, two BPSK modulators 200 and a Lange coupler 320. The BPSK modulators 200 connect to power output ends of the Wilkinson power divider 310, respectively, for receiving inputs from the Wilkinson power divider 310. The Lange coupler 320 connects to the BPSK modulators 200, respectively, for receiving inputs from the BPSK modulators 200.

Two message signals Q+, Q− are inputted to one of the BPSK modulators and another two message signals I+, I− are inputted to another one of the BPSK modulators. One of the BPSK modulators generates an output signal according to the message signal Q+, Q−. Another one of the BPSK modulators generates another one output signal according to message signal I+, I−. The message signals Q+, Q− can be a pair of differential signals, that is, the message signal Q+, Q− is not all set to low nor all set to high. The message signal I+, I− can be another one pair of differential signals, that is, the message signal I+, I− is not all set to low nor all set to high.

The Wilkinson Power divider 310 can utilize a Grounded Coplanar Waveguide (GCPW) design to reduce the amplitude and phase error of the modulator while inputting powers to the baluns of the BPSK modulators 200 via coplanar waveguide transmission lines.

Two divided power signals from the Wilkinson Power divider 310 can pass through the BPSK modulators 200, respectively, with the phase combination of (0°,0°), (0°, 180°), (180°, 0°) or (180°,180°). The four phase combinations of signals outputted from BPSK modulators 200 input to the Lance coupler 320 and thus the quadrature modulator 300 forms four different phases of the output signal.

For example, when I+ and Q+ are set to high and I− and Q− are set to low, the phase of the output signal is ideally 0 degrees, which is in a first state (−1); when I− and Q+ are set to high and I+ and Q− are set to low, the phase of the output signal is ideally 270 degrees, which is in a second state (−2); when I+ and Q− is set to high and I− and Q+ set to low, the phase of the output signal is ideally 90 degrees, which is in a third state (−3); and when I− and Q− are set high and I+ and Q+ are set low, the phase of the output signal is 180 degrees, which is in a fourth state (−4). When all the bias voltages are the same at half of the high level, output signal is at a minimum value. In this case, the circuit is turned off.

The BPSK modulators 200 of FIG. 6 can be identical to the BPSK modulators 200, 200' of FIG. 4 and FIG. 5. Therefore, the quadrature modulator 300 of FIG. 6 has four couplers, eight diodes, eight DC block units and eight bias paths in the two BPSK modulators 200, wherein each of the eight DC block units has a capacitor and a resistor which are configured as FIG. 2. However, FIG. 6 does not show the detailed circuit diagrams with above elements for the object of convenience. The eight diodes can be implemented by PIN diodes which can use Potassium arsenide as a substrate. The quadrature modulator 300 can be integrated in a monolithic microwave integrated circuit.

In a higher-level digital modulation system, the quadrature modulator of the present disclosure can achieve any amplitude and phase control. Specifically, the design method can adopt two sets of reflective two-phase modulators, 90-degree couplers and power combiners. The 90-degree couplers mainly provide orthogonal carrier signals and generate individual orthogonal carrier signals for further input to two sets of reflective two-phase modulation. The modulating signals of the respective modulations are then combined by the power combiner. If the two-phase modulator only 0 and 180 degrees phase modulation function, the quadrature modulator can only produce 0, 90, 180 and 270 degrees phase modulation. To increase the amplitude and phase modulation, such as n-QAM higher-level digital modulation, two-phase reflective modulator must also have a linear amplitude modulation capability, by the linear modulation of the orthogonal carrier signal, arbitrary amplitude and phase modulation signal can be generated.

In conclusion, the aforesaid signal modulators feature broadband, low insertion loss, low required local oscillation drive power, low phase and amplitude imbalance, excellent modulation quality and small required die area.

The present disclosure is disclosed above by preferred embodiments. However, persons skilled in the art should understand that the preferred embodiments are illustrative of the present disclosure only, but should not be interpreted as restrictive of the scope of the present disclosure. Hence, all equivalent modifications and replacements made to the aforesaid embodiments should fall within the scope of the present disclosure. Accordingly, the legal protection for the present disclosure should be defined by the appended claims.

What is claimed is:

1. A reflective modulator comprises:
    a coupler having an input end, an output end, a first load end and a second load end, the input end being used to receive an input signal, the output end being used to output an output signal;
    a first diode;
    a second diode;
    a first DC (Direct Current) block unit connected between the first diode and the first load end of the coupler for DC blocking; and
    a second DC block unit connected between the second diode and the second load end of the coupler for DC blocking;
    wherein a message signal is inputted to both of the first and second DC block units for operating the states of the first and second diodes.

2. The reflective modulator of claim 1, wherein the first and second diodes turn on when the message signal is large enough, and the first and second diodes turn off when the message signal is not large enough.

3. The reflective modulator of claim 1, wherein the first DC block unit includes a first capacitor and a first resistor, the second DC block unit includes a second capacitor and a second resistor, the first capacitor is connected between the first diode and the first load end of the coupler for DC blocking, the first resistor is connected with the first capacitor and the first diode, the second capacitor is connected between the second diode and the second load end of the coupler for DC blocking, and the second resistor is connected with the second capacitor and the second diode.

4. The reflective modulator of claim 1, wherein the first and second diodes are implemented by PIN diodes.

5. The reflective modulator of claim 1, wherein the input signal is generated from a local oscillator and the output signal is used for radio frequency.

6. A BPSK (Binary Phase Shift Keying) modulator comprises:
    a balun having a first conductor, a second conductor, a third conductor and a fourth conductor, the first conductor and the second conductor is connected and used to have equal currents in opposite directions, one end of the third conductor magnetically coupling to the first conductor and another end of the third conductor connecting to ground, one end of the fourth conductor magnetically coupling to the second conductor and another end of the fourth conductor connecting to ground;

a first reflective modulator, wherein a first input end of the first reflective modulator is connected to the third conductor;

a second reflective modulator, wherein a second input end of the second reflective modulator is connected to the fourth conductor; and a power combiner connected to a first output end of the first reflective modulator and a second output end of the first reflective modulator, wherein a first message signal is inputted to the first reflective modulator and a second message signal is inputted to the second reflective modulator, and the first message signal and the second message signal are a pair of differential signals;

wherein the first reflective modulator comprises a first coupler, a first diode, a second diode, a first DC (Direct-Current) block unit and a second DC block unit, the first coupler having the first input end, the first output end, a first load end and a second load end, the first DC block unit connecting between the first diode and the first load end of the first coupler for DC blocking, the second DC block unit connected between the second diode and the second load end of the first coupler for DC blocking, the first message signal inputting to both of the first and second DC block units for operating the state of the first and second diodes;

wherein the second reflective modulator comprises a second coupler, a third diode, a fourth diode, a third DC block unit and a fourth DC block unit, the second coupler having the second input end, the second output end, a third load end and a fourth load end, the third DC block unit connecting between the third diode and the third load end of the second coupler for DC blocking, the fourth DC block unit connecting between the fourth diode and the fourth load end of the second coupler for DC blocking, the second message signal inputting to both of the third and fourth DC block units for operating the state of the third and fourth diodes.

7. The BPSK modulator of claim 6, wherein the first and second diodes turn on when the first message signal is large enough, and the first and second diodes turn off when the first message signal is not large enough; and wherein the third and fourth diodes turn on when the second message signal is large enough, and the third and fourth diodes turn off when the second message signal is not large enough.

8. The BPSK modulator of claim 6, wherein the first DC block unit includes a first capacitor and a first resistor, the second DC block unit includes a second capacitor and a second resistor, the first capacitor is connected between the first diode and the first load end of the first coupler for DC blocking, the first resistor is connected with the first capacitor and the first diode, the second capacitor is connected between the second diode and the second load end of the first coupler for DC blocking, and the second resistor is connected with the second capacitor and the second diode.

9. The BPSK modulator of claim 8, wherein the third DC block unit includes a third capacitor and a third resistor, the fourth DC block unit includes a fourth capacitor and a fourth resistor, the third capacitor is connected between the third diode and the third load end of the second coupler for DC blocking, the third resistor is connected with the third capacitor and the third diode, the fourth capacitor is connected between the fourth diode and the fourth load end of the second coupler for DC blocking, and the fourth resistor is connected with the fourth capacitor and the fourth diode.

10. The BPSK modulator of claim 6, wherein the first, second, third and fourth diodes are implemented by PIN diodes.

11. The BPSK modulator of claim 6, wherein an input signal is generated from a local oscillator and inputted to the balun, and an output signal is outputted from the power combiner and used for radio frequency.

12. The BPSK modulator of claim 6, wherein the BPSK modulator is integrated in a monolithic microwave integrated circuit.

13. A quadrature modulator comprises:

a Wilkinson power divider having a power input end, a first power output end and a second power output end;

a first BPSK (Binary Phase Shift Keying) modulator connected to the first power output end of the Wilkinson power divider;

a second BPSK modulator connected to the second power output end of the Wilkinson power divider, the second BPSK modulator generating a second output signal; and a Lange coupler connected to the first BPSK modulator and the second BPSK modulator for receiving a first output signal and a second output signal, wherein a first message signal and a second message signal are inputted to the first BPSK modulator, a third message signal and a fourth message signal are inputted to the second BPSK modulator, the first BPSK modulator generates the first output signal according to the first message signal, the second message signal, and an input from the Wilkinson power divider, and the second BPSK modulator generates the second output signal according to the third message signal, the fourth message signal, and an input from the Wilkinson power divider, wherein the first BPSK modulator comprises a first balun, a first reflective modulator, a second reflective modulator and a first power combiner, the first balun having a first conductor, a second conductor, a third conductor and a fourth conductor, the first conductor and the second conductor being connected and used to have equal currents in opposite directions, one end of the third conductor magnetically coupling to the first conductor and another end of the third conductor connecting to ground, one end of the fourth conductor magnetically coupling to the second conductor and another end of the fourth conductor connecting to ground, a first input end of the first reflective modulator connecting to the third conductor, a second input end of the second reflective modulator connecting to the fourth conductor, the first power combiner connecting to a first output end of the first reflective modulator and a second output end of the second reflective modulator, the first message signal inputting to the first reflective modulator, the second message signal inputting to the second reflective modulator, the first message signal and the second message signal being a pair of differential signals;

wherein the second BPSK modulator comprises a second balun, a third reflective modulator, a fourth reflective modulator and a second power combiner, the second balun having a fifth conductor, a sixth conductor, a seventh conductor and an eighth conductor, the fifth conductor and the sixth conductor being connected and used to have equal currents in opposite directions, one end of the seventh conductor connecting to the fifth conductor and another end of the seventh conductor connecting to ground, one end of the eighth conductor connecting to the sixth conductor and another end of the eighth conductor connecting to ground, a third input end of the third reflective modulator connecting to the seventh conductor, a fourth input end of the fourth reflective modulator connecting to the eighth conductor, the second power combiner connecting to a third output end of the third reflective modulator and a fourth output end of the fourth reflective modulator, the third message signal inputting to the third reflective modulator, the fourth message signal inputting to the fourth reflective modulator, the third message signal and the fourth message signal being a pair of differential signals;

wherein the first reflective modulator comprises a first coupler, a first diode, a second diode, a first DC (Direct-Current) block unit and a second DC block unit, the first coupler having the first input end, the first output end, a first load end and a second load end, the first diode connecting to the first load end of the first coupler, the second diode connecting to the second load end of the first coupler, the first DC block unit connecting between the first diode and the first load end of the first coupler for DC blocking, the second DC block unit connected between the second diode and the second load end of the first coupler for DC blocking, the first message signal inputting to both of the first and second DC block units for operating the state of the first and second diodes;

wherein the second reflective modulator comprises a second coupler, a third diode, a fourth diode, a third DC block unit and a fourth DC block unit, the second coupler having the second input end, the second output end, a third load end and a fourth load end, the third diode connecting to the third load end of the second coupler, the fourth diode connecting to the fourth load end of the second coupler, the third DC block unit connecting between the third diode and the third load end of the second coupler for DC blocking, the fourth DC block unit connecting between the fourth diode and the fourth load end of the second coupler for DC blocking, the second message signal inputting to both of the third and fourth DC block units for operating the state of the third and fourth diodes;

wherein the third reflective modulator comprises a third coupler, a fifth diode, a sixth diode, a fifth DC block unit and a sixth DC block unit, the third coupler having the third input end, the third output end, a fifth load end and a sixth load end, the fifth diode connecting to the fifth load end of the third coupler, the sixth diode connecting to the sixth load end of the third coupler, the fifth DC block unit connecting between the fifth diode and the fifth load end of the third coupler for DC blocking, the sixth DC block unit connecting between the sixth diode and the sixth load end of the third coupler for DC blocking, the third message signal inputting to both of the fifth and sixth DC block units for operating the state of the fifth and sixth diodes; and wherein the fourth reflective modulator comprises a fourth coupler, a seventh diode, an eighth diode, a seventh DC block unit and an eighth DC block unit, the fourth coupler having the fourth input end, the fourth output end, a seventh load end and a eighth load end, the seventh diode connecting to the seventh load end of the fourth coupler, the eighth diode connecting to the eighth load end of the fourth coupler, the seventh DC block unit connecting between the seventh diode and the seventh load end of the fourth coupler for DC blocking, the eighth DC block unit connecting between the eighth diode and the eighth load end of the fourth coupler for DC blocking, the fourth message signal inputting to both of the seventh and eighth DC block units for operating the state of the seventh and eighth diodes.

14. The quadrature modulator of claim 13,
wherein the first and second diodes turn on when the first message signal is large enough, and the first and second diodes turn off when the first message signal is not large enough;
wherein the third and fourth diodes turn on when the second message signal is large enough, and the third and fourth diodes turn off when the second message signal is not large enough;
wherein the fifth and sixth diodes turn on when the third message signal is large enough, and the fifth and sixth diodes turn off when the third message signal is not large enough; and
wherein the seventh and eighth diodes turn on when the fourth message signal is large enough, and the seventh and eighth diodes turn off when the fourth message signal is not large enough.

15. The quadrature modulator of claim 13,
wherein the first DC block unit includes a first capacitor and a first resistor, the second DC block unit includes a second capacitor and a second resistor, the first capacitor is connected between the first diode and the first load end of the first coupler for DC blocking, the first resistor is connected with the first capacitor and the first diode, the second capacitor is connected between the second diode and the second load end of the first coupler for DC blocking, and the second resistor is connected with the second capacitor and the second diode;
wherein the third DC block unit includes a third capacitor and a third resistor, the fourth DC block unit includes a fourth capacitor and a fourth resistor, the third capacitor is connected between the third diode and the third load end of the second coupler for DC blocking, the third resistor is connected with the third capacitor and the third diode, the fourth capacitor is connected between the fourth diode and the fourth load end of the second coupler for DC blocking, and the fourth resistor is connected with the fourth capacitor and the fourth diode;
wherein the fifth DC block unit includes a fifth capacitor and a fifth resistor, the sixth DC block unit includes a sixth capacitor and a sixth resistor, the fifth capacitor is connected between the fifth diode and the fifth load end of the third coupler for DC blocking, the fifth resistor is connected with the fifth capacitor and the fifth diode, the sixth capacitor is connected between the sixth diode and the sixth load end of the third coupler for DC blocking, and the sixth resistor is connected with the sixth capacitor and the sixth diode; and
wherein the seventh DC block unit includes a seventh capacitor and a seventh resistor, the eighth DC block unit includes a eighth capacitor and a eighth resistor, the seventh capacitor is connected between the seventh diode and the seventh load end of the fourth coupler for DC blocking, the seventh resistor is connected with the seventh capacitor and the seventh diode, the eighth capacitor is connected between the eighth diode and the eighth load end of the fourth coupler for DC blocking, and the eighth resistor is connected with the eighth capacitor and the eighth diode.

16. The quadrature modulator of claim 13, wherein the first, second, third, fourth, fifth, sixth, seventh and eighth diodes are implemented by PIN diodes.

17. The quadrature modulator of claim 13, wherein an input signal inputted to the power input end of Wilkinson power divider is generated from a local oscillator, and an output signal is outputted from the Lange coupler and used for radio frequency.

18. The quadrature modulator of claim 13, wherein the quadrature modulator is integrated in a monolithic microwave integrated circuit.

\* \* \* \* \*